(12) United States Patent
Kwan (10) Patent No.: US 7,710,300 B2
(45) Date of Patent: May 4, 2010

(54) SEGMENTED DATA SHUFFLER APPARATUS FOR A DIGITAL TO ANALOG CONVERTER (DAC)

(75) Inventor: Tom W. Kwan, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/081,547

(22) Filed: Apr. 17, 2008

(65) Prior Publication Data
US 2009/0251346 A1 Oct. 8, 2009

Related U.S. Application Data

(60) Provisional application No. 61/042,200, filed on Apr. 3, 2008.

(51) Int. Cl.
*H03M 3/00* (2006.01)
*H03M 1/66* (2006.01)

(52) U.S. Cl. ........................................ 341/143; 341/144
(58) Field of Classification Search ................. 341/143, 341/144
See application file for complete search history.

(56) References Cited

U.S. PATENT DOCUMENTS 4,704,600 A * 11/1987 Uchimura et al. ........... 341/143
5,061,928 A * 10/1991 Karema et al. .............. 341/143
5,369,403 A * 11/1994 Temes et al. ................ 341/143
5,982,317 A * 11/1999 Steensgaard-Madsen .... 341/143
2002/0105453 A1* 8/2002 Fujimori et al. ............. 341/144
2004/0021594 A1* 2/2004 Melanson .................... 341/143
2004/0032355 A1* 2/2004 Melanson .................... 341/143

* cited by examiner

*Primary Examiner*—Howard Williams
(74) *Attorney, Agent, or Firm*—Sterne, Kessler, Goldstein & Fox P.L.L.C.

(57) ABSTRACT

A sigma-delta digital to analog converter (DAC) module converts the digital input signal to the analog output signal through segmentation, including a primary and a secondary sigma-delta modulator. The primary sigma-delta modulator produces a primary digital segment and a primary quantization error. A primary sample is delayed, decoded, scrambled and converted to produce a primary analog segment. A secondary sigma-delta modulates the primary quantization error to produce a secondary digital segment which is noise shaped by a noise transfer function of the primary sigma-delta modulator to produce a noise shaped secondary digital segment which is decoded, scrambled, converted and scaled to produce a secondary analog segment. An adder combines the primary analog segment and the secondary analog segment to produce the analog output signal.

18 Claims, 6 Drawing Sheets

FIG. 1A (CONVENTIONAL)

FIG. 1B (CONVENTIONAL)

FIG. 1C (CONVENTIONAL)

SEGMENTED DATA SHUFFLER APPARATUS FOR A DIGITAL TO ANALOG CONVERTER (DAC)

CROSS-REFERENCE TO RELATED APPLICATIONS

The present application claims the benefit of U.S. Provisional Patent Appl. No. 61/042,200, filed Apr. 3, 2008, entitled "Segmented Data Shuffler Apparatus for a Digital to Analog Converter (DAC)," which is incorporated herein by reference in its entirety.

FIELD OF THE INVENTION

The present invention relates generally to a digital to analog converter (DAC) and more specifically to a segmented data shuffler apparatus for a sigma-delta DAC.

BACKGROUND

A digital-to-analog converter (DAC) is an electronic circuit that receives an n-bit digital word and generates an analog output that is proportional to the received digital word. Digital codes are typically converted to analog voltages by assigning a voltage weight to each bit in the digital code and then summing the voltage weights of the entire code.

DACs can be designed for a wide range of applications, including general data acquisition applications and special applications, such as, but not limited to, video or graphic outputs, high definition video displays, ultra high-speed signal processing, and digital video recording.

The major factors that determine the performance quality of a DAC are resolution, speed, and linearity. Resolution refers to the smallest change in the output analog signal that is supported. The resolution determines the total number of digital codes, or quantization levels that will be recognized by a converter. The speed of a DAC is determined by the time it takes to perform the conversion process. Measurement accuracy is specified by a DAC's linearity. Integral linearity, which is also referred to as relative accuracy, is a measure of the linearity over the entire conversion range. It is often defined as the deviation from a straight line drawn between the endpoints and through zero (or offset value) of the conversion range. A DAC may use scrambling to increase linearity in the presence of non-linearities such as mismatches.

The accuracy of a DAC is critical in certain applications. The accuracy of a DAC may be increased by increasing the resolution of the DAC. Increasing the resolution often increases the cost and power requirements of the DAC.

Therefore, what are needed are systems and methods to reduce the impact of increasing the resolution of the DAC to improve DAC accuracy.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s).

The example embodiments described herein are provided for illustrative purposes, and are not limiting. Further structural and operational embodiments, including modifications/alterations, will become apparent to persons skilled in the relevant art(s) from the teachings herein.

Figure 1A:
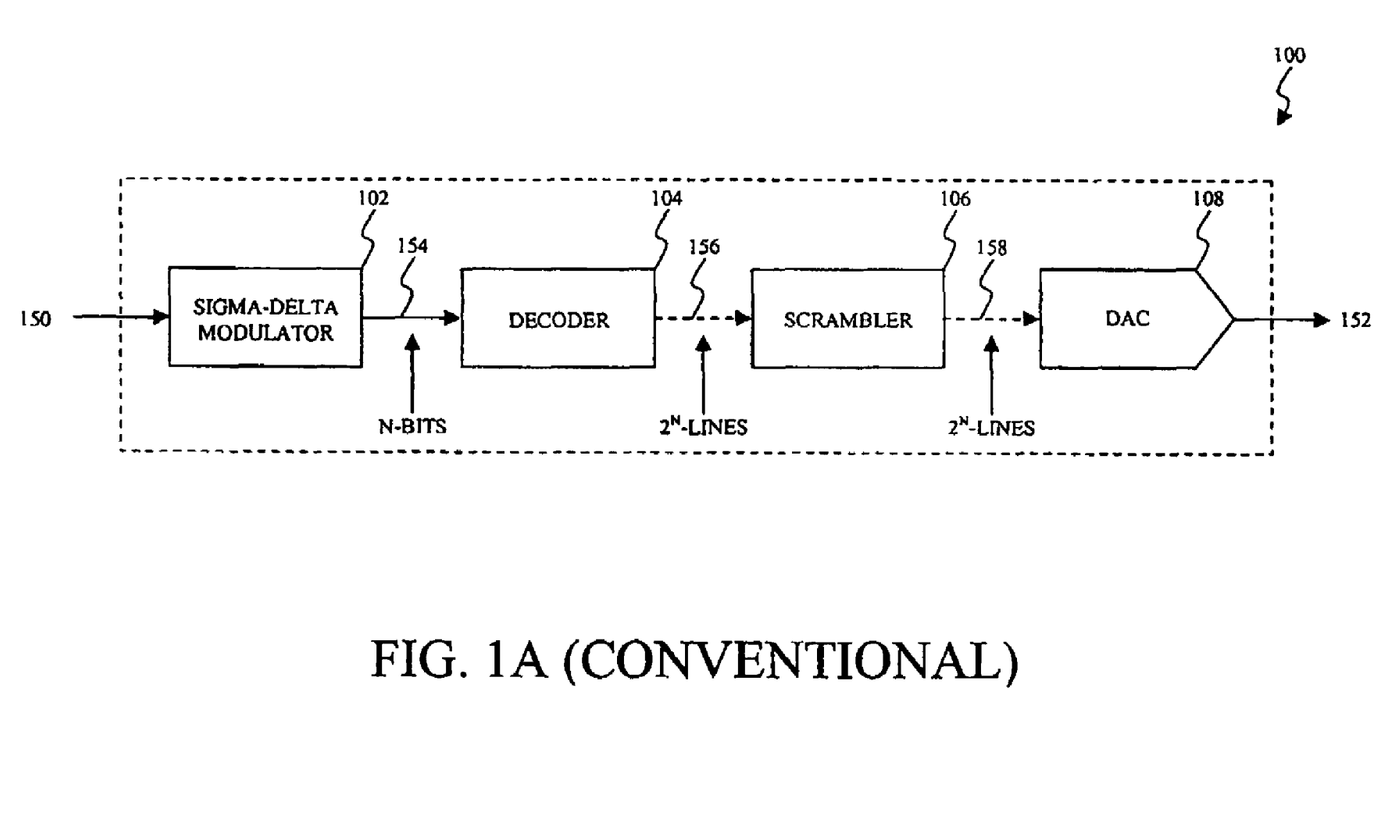
FIG. 1A illustrates a block diagram of a conventional over-sampled sigma-delta digital to analog converter (DAC) module.

FIG. 1A illustrates a block diagram of a conventional digital to analog converter (DAC) module. A conventional oversampled sigma-delta DAC module 100 converts a digital input signal 150 to an analog output signal 152. The digital input signal 150 includes M bits represented by bits $B_1$ through $B_M$, where $B_M$ represents a most significant bit (MSB) of the digital input signal 150 and $B_1$ represents a least significant bit (LSB) of the digital input signal 150.

As shown in FIG. 1A, the conventional oversampled sigma-delta DAC module 100 includes a sigma-delta modulator 102, a decoder 104, a scrambler 106, and a digital to analog converter (DAC) 108. The sigma-delta modulator 102 produces a truncated digital signal 154 by sigma-delta modulating the digital input signal 150. More specifically, the sigma-delta modulator 102 reduces the resolution of the digital input signal 150 from M bits to N bits, where N is substantially less than or equal to M, by integrating and/or quantizing the digital input signal 150. For example, the sigma-delta modulator 102 reduces the resolution of the digital input signal 150 from sixteen bits to six bits. The sigma-delta modulator 102 may include a first order delta sigma modulator, a second order delta sigma modulator, a multi-stage noise shaping (MASH) modulator and/or any other suitable well-known sigma-delta modulator.

The decoder 104 decodes the truncated digital signal 154 from N bits to $2^N$ lines to produce a decoded digital signal 156. In other words, the decoder 104 maps a current value of the truncated digital signal 154 from N bits to a corresponding set of lines amongst the $2^N$ lines. From the example above, the decoder 104 maps the truncated digital signal 154 from six bits to sixty four lines. The decoder 104 may decode the N bits of the truncated digital signal 154 to $2^N$ lines using any suitable code such as a well known thermometer code to provide an example.

The scrambler 106 scrambles the decoded digital signal 156 to produce a scrambled digital signal 158. More specifically, the scrambler 106 dynamically maps the decoded digital signal 156 to the scrambled digital signal 158 such that the decoded digital signal 156 is equally represented in the scrambled digital signal 158 over a relatively small number of clock cycles. The scrambler 106 is described in further detail in FIG. 1B through FIG. 1C.

The DAC 108 converts the scrambled digital signal 158 from a digital representation to an analog representation to produce the analog output signal 152.

Figure 1B:
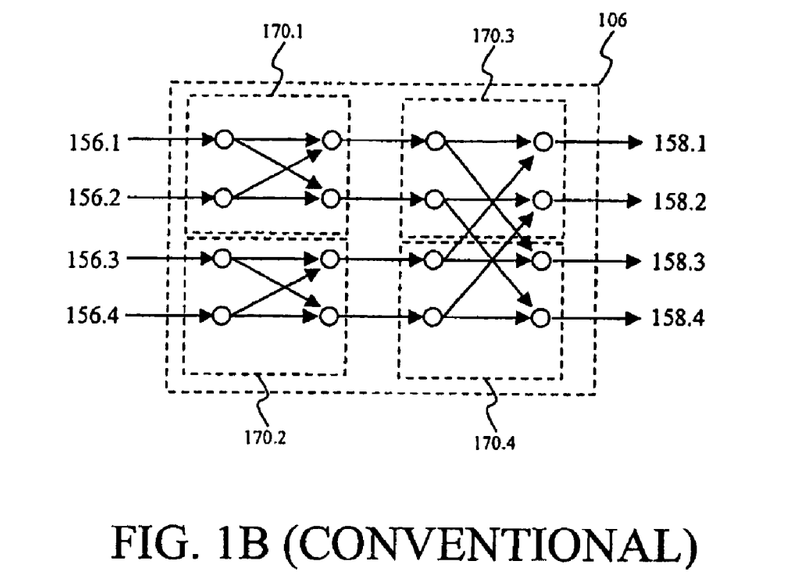
FIG. 1B illustrates a block diagram of a conventional scrambler.

FIG. 1B illustrates a block diagram of a conventional scrambler. From the discussion above, the scrambler 106 scrambles the decoded digital signal 156 to produce a scrambled digital signal 158. The scrambler 106 scrambles a two bit signal represented by four lines, denoted as the decoded digital signal 156.1 through 156.4, to produce a four line scrambled output, denoted as scrambled digital signal 158.1 through 158.4. The scrambler 106 may be arranged in a "butterfly architecture" similar to one commonly used in Fast Fourier Transform (FFT) algorithms. The scrambler 106 includes four butterfly circuits 170.1 through 170.4 to dynamically map the decoded digital signal 156 to the scrambled digital signal 158 such that the decoded digital signal 156 is equally represented in the scrambled digital signal 158 over a relatively small number of clock cycles. The butterfly circuit 170.1 scrambles or swaps the decoded digital signal 156.1 and the decoded digital signal 156.2. Likewise, the butterfly circuit 170.2 scrambles or swaps the decoded digital signal 156.3 and the decoded digital signal 156.4. The butterfly circuit 170.3 scrambles or swaps the decoded digital signal 156.1 and the decoded digital signal 156.3. Likewise, the butterfly circuit 170.4 scrambles or swaps the decoded digital signal 156.2 and the decoded digital signal 156.4.

Figure 1C:
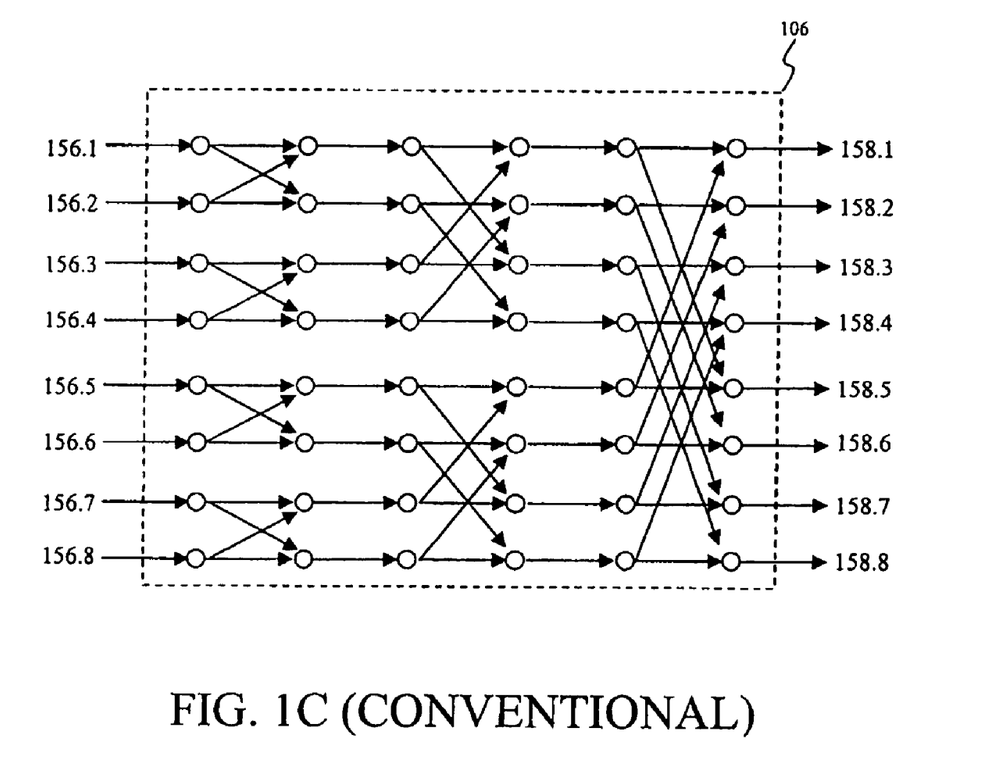
FIG. 1C illustrates a block diagram of another conventional scrambler.

Extending a number of bits of the decoded digital signal 156, and consequently a number lines in the decoded digital signal 156, from two to three bits increases the number of butterfly circuits 170 in the scrambler 106. FIG. 1C illustrates a block diagram of another conventional scrambler. From the discussion above, the scrambler 106 scrambles the decoded digital signal 156 to produce a scrambled digital signal 158. The scrambler 106 scrambles a three bit signal represented by eight lines, denoted as the decoded digital signal 156.1 through 156.8, to produce an eight line scrambled output, denoted as scrambled digital signal 158.1 through 158.8. The scrambler 106 includes twelve butterfly circuits 170 to dynamically map the decoded digital signal 156 to the scrambled digital signal 158 such that the decoded digital signal 156 is equally represented in the scrambled digital signal 158 over a relatively small number of clock cycles. In general, a decoded digital signal 156 having $2^B$ lines requires $2^{(B-1)}*B$ butterfly circuits 170. For example, the scrambler 106 uses 192 butterfly circuits 170 for a decoded digital signal 156 having sixty-four lines.

Increasing the resolution of a conventional oversampled sigma-delta DAC module 100 from N-bits to N+1 bits increases the number of lines in the decoded digital signal 156 from $2^N$ lines to $2^{N+1}$ lines. As a result, the number of butterfly circuits 170 in the scrambler 106 increases from $2^{(N-1)}*N$ to $2^N*(N+1)$. For example, increasing the resolution of the truncated digital signal 154 from six-bits to seven bits increases the number of butterfly circuits 170 in the scrambler 106 increases from 192 to 448. However, the examples shown in FIG. 1B and FIG. 1C are not limiting, those skilled in the relevant art(s) will recognize that the scrambler 106 may be implemented using any suitable means to scramble one or decoded digital signals to one or more scrambled digital signal without departing from the spirit and scope of the present invention.

Figure 2:
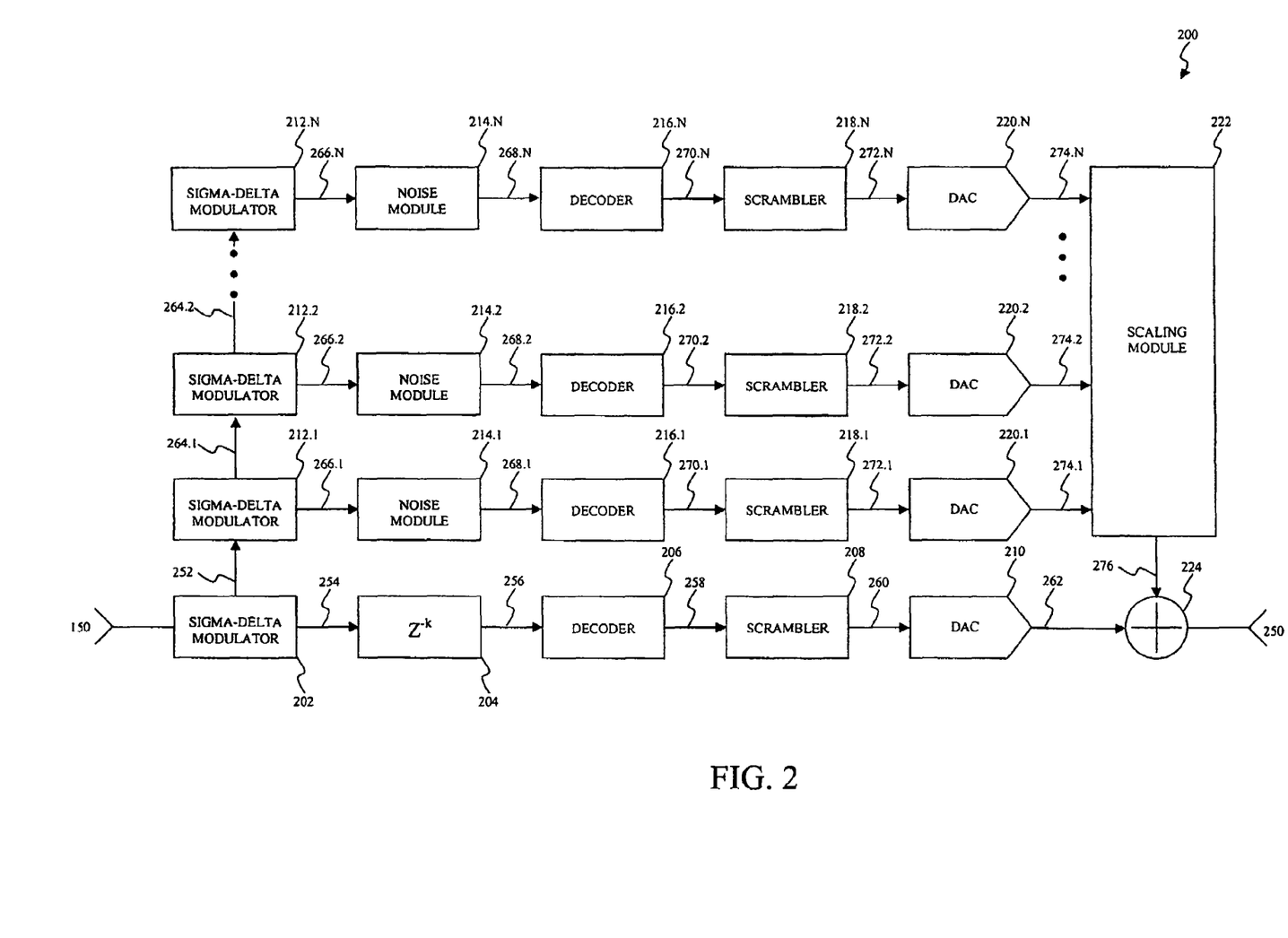
FIG. 2 illustrates a block diagram of a digital to analog converter (DAC) module according to an exemplary embodiment of the present invention.

FIG. 2 illustrates a block diagram of a digital to analog converter (DAC) module according to an exemplary embodiment of the present invention. In contrast to the conventional oversampled sigma-delta DAC module 100, as to be discussed in further detail below, a resolution of a DAC module 200 may be increased from N-bits to N+1 bits without a substantial increase in the number of butterfly circuits 170 in a corresponding scrambler. However, this example is not limiting, those skilled in the relevant art(s) will recognize that the resolution of the DAC module 200 may be increased to any suitable number of bits without a substantial increase in the number of butterfly circuits 170 in the corresponding scrambler without departing from the spirit and scope of the present invention.

The DAC module 200 converts a digital input signal 150 to an analog output signal 250. The digital input signal 150 includes M bits represented by bits $B_1$ through $B_M$, where $B_M$ represents a most significant bit (MSB) of the digital input signal 150 and $B_1$ represents a least significant bit (LSB) of the digital input signal 150. However, this example is not limiting, those skilled in the relevant art(s) will recognize that the digital input signal 150 may include any suitable number of bits in any suitable arrangement without departing from the spirit and scope of the present invention.

Referring back to FIG. 2, a primary sigma-delta modulator 202 receives the digital input signal 150. The primary sigma-delta modulator 202 sigma-delta modulates the digital input signal 150 to produce a primary digital segment 254. The primary sigma-delta modulator 202 may include a first order delta sigma modulator, a second order delta sigma modulator, a multi-stage noise shaping (MASH) modulator and/or any other suitable well-known sigma-delta modulator. More specifically, the primary sigma-delta modulator 202 produces the primary digital segment 254 by integrating and/or quantizing the digital input signal 150 to s bits, where s represents an integer number less than M. In other words, the primary sigma-delta modulator 202 equivalently truncates the digital input signal 150 to s bits. In an exemplary embodiment, the primary sigma-delta modulator 202 reduces the resolution of the digital input signal 150 from sixteen bits to four bits. The primary digital segment 254 may be represented as:

$$y_p[n]=x_i[n]+q_p[n]*h_p[n] \qquad (1),$$

where $y_p[n]$ represents the primary digital segment 254, $x_i[n]$ represents the digital input signal 150, $q_p[n]$ represents a primary quantization error denoted as a primary quantization error 252 in FIG. 2, and $h_p[n]$ represents an impulse response of a noise transfer function of the primary sigma-delta modulator 202.

A primary sample delay 204 delays the primary digital segment 254 by k samples to produce a delayed primary digital segment 256, where k may represent an integer value corresponding to a number of secondary sigma-delta modulators 212.1 through 212.N to be discussed below. In an exemplary embodiment, the primary sample delay 204 delays the primary digital segment 254 by one sample.

A primary decoder module 206 decodes the delayed primary digital segment 256 from s bits to $2^s$ lines to produce a primary decoded digital signal 258. From the example above, the primary decoder module 206 maps the delayed primary digital segment 256 from four bits to sixteen lines. The primary decoder module 206 operates in a manner that is substantially similar to the decoder 104 and therefore will not be described in further detail.

A primary scrambler 208 scrambles the primary decoded digital signal 258 to produce a primary scrambled digital signal 260. From the example above, the primary scrambler 208 uses 32 butterfly circuits 170 for the delayed primary digital segment 256 having sixteen lines. The primary scrambler 208 operates in a manner that is substantially similar to the scrambler 106 and therefore will not be described in further detail.

A primary DAC 210 converts the primary scrambled digital signal 260 from a digital representation to an analog representation to produce a primary analog segment 262.

As to be discussed below, the DAC module 200 may include one or more secondary sigma-delta modulators 212.1 through 212.N. The secondary sigma-delta modulators 212.1 through 212.N allow the resolution of the DAC module 200 to be increased from s bits to s+1 bits without an increase in the number of butterfly circuits 170 in the primary scrambler 208. However, this example is not limiting, those skilled in the relevant art(s)s will recognize that the resolution of the DAC module 200 may be increased to any suitable number of bits without an increase in the number of butterfly circuits 170 in the primary scrambler 208 without departing from the spirit and scope of the present invention. Those skilled in the relevant art(s) will recognize that the one or more secondary sigma-delta modulators may substantially reduce the primary quantization error $q_p[n]$.

A secondary sigma-delta modulator 212.1 may receive the primary quantization error 252. The secondary sigma-delta modulator 212.1 sigma-delta modulates the primary quantization error 252 to produce a secondary digital segment 266.1. More specifically, the secondary sigma-delta modulator 212.1 produces the secondary digital segment 266.1 by integrating and/or quantizing the primary quantization error 252 to t bits, where t represents an integer number substantially less than or equal to M. In other words, the secondary sigma-delta modulator 212.1 equivalently truncates the primary quantization error 252 to t bits. In an exemplary embodiment, the secondary sigma-delta modulator 212.1 equivalently truncates the primary quantization error 252 to two bits. The secondary digital segment 266.1 may be represented as:

$$y_{s1}[n]=q_p[n]+q_{s1}[n]*h_{n1}[n] \qquad (2),$$

where $y_{s1}[n]$ represents the secondary digital segment 266.1, $q_p[n]$ represents the primary quantization error, $q_{s1}[n]$ represents a first secondary quantization error, and $h_{n1}[n]$ represents an impulse response of a noise transfer function of the secondary sigma-delta modulator 212.1. The first secondary quantization error $q_{s1}[n]$, denoted as a secondary quantization error 264.1 in FIG. 2, represents a difference between the primary quantization error 252 and the secondary digital segment 266.1. In other words, the secondary quantization error 264.1 may represent a digital equivalent of a remaining M-s-t bits of the digital input signal 150.

A secondary noise module 214.1 shapes the secondary digital segment 266.1 by a noise transfer function of the primary sigma-delta modulator 202 to produce a noise shaped secondary digital segment 268.1. The noise shaped secondary digital segment 268.1 may be represented as:

$$y_{n1}[n]=q_p[n]*h_p[n]+q_{s1}[n]*h_{n1}[n]*h_p[n] \qquad (3),$$

where $y_{n1}[n]$ represents the noise shaped secondary digital segment 268.1, $q_p[n]$ represents the primary quantization error, $h_p[n]$ represents the impulse response of the noise the noise transfer function of the primary sigma-delta modulator 202, $q_{s1}[n]$ represents the first secondary quantization error, and $h_{n1}[n]$ represents the impulse response of the noise transfer function of the secondary sigma-delta modulator 212.1. In an exemplary embodiment, the secondary noise module 214.1 provides overlap to the secondary digital segment 266.1 to allow the secondary noise module 214.1 to be implemented in a similar manner as the primary scrambler 208. In other words, the noise shaped secondary digital segment 268.1 has a substantially equivalent bit length as the delayed primary digital segment 256. However, this example is not limiting, those skilled in the relevant art(s) will recognize that the secondary noise module 214.1 need not provide overlap without departing from the spirit and scope of the present invention.

A secondary decoder module 216.1 decodes the noise shaped secondary digital segment 268.1 from t bits to $2^t$ lines to produce a secondary decoded digital signal 270.1. From the example above, the primary decoder module 206 maps the noise shaped secondary digital segment 268.1 from four bits to sixteen lines. The secondary decoder module 216.1 operates in a manner that is substantially similar to the decoder 104 and therefore will not be described in further detail.

A secondary scrambler 218.1 scrambles the secondary decoded digital signal 270.1 to produce a secondary scrambled digital signal 272.1. From the example above, the secondary scrambler 218.1 uses 32 butterfly circuits 170 for the noise shaped secondary digital segment 268.1 having sixteen lines. In an exemplary embodiment, the secondary scrambler 218.1 is implemented in a similar manner as the primary scrambler 208. The secondary scrambler 218.1 operates in a manner that is substantially similar to the scrambler 106 and therefore will not be described in further detail.

A secondary DAC 220.1 converts the secondary scrambled digital signal 272.1 from a digital representation to an analog representation to produce a secondary analog segment 274.1.

A scaling module 222 scales or reduces the magnitude of the secondary analog segment 274.1 by a scaling factor of $2^t$ to produce the secondary analog segment 276. From the discussion above, the secondary sigma-delta modulator 212.1 equivalently truncates the secondary quantization error 264 to t bits. Likewise, the secondary sigma-delta modulator 212.2 equivalently truncates the secondary quantization error 264.1 to u bits.

An adder 224 combines the primary analog segment 262 and the secondary analog segment 274.1 to produce the analog output signal 250. The analog output signal 250 may be represented as:

$$y_i[n] = x_i[n] + \frac{q_{s1}[n] * h_{n1}[n] * h_p[n]}{2^t}, \quad (4)$$

where $y_i[n]$ represents the analog output signal 250, $q_{s1}[n]$ represents the first secondary quantization error, $h_{n1}[n]$ represents the impulse response of the noise transfer function of the secondary sigma-delta modulator 212.1, $h_p[n]$ represents the impulse response of the noise transfer function of the primary sigma-delta modulator 202, and $2^t$ represents the scaling factor.

The resolution of the DAC module 200 may be further increased without an increase in the number of butterfly circuits 170 in the primary scrambler 208 by including additional sigma-delta modulators 212.2 through 212.N. Although the DAC module 200 may include the primary scrambler 208 and the secondary scrambler 218.1, the number of butterfly circuits 170 in the primary scrambler 208 and the secondary scrambler 218.1 is substantially less then a number of butterfly circuits 170 in the scrambler 106 for a substantially similar bit resolution. Those skilled in the relevant art(s) will recognize that the quantity $$\frac{q_{s1}[n] * h_{n1}[n] * h_p[n]}{2^t}$$

from (4) is substantially less than or equal to the quantity $q_p[n]*h_p[n]$ from (1). As a result, quantization noise embedded in the analog output signal 250 has been substantially reduced by including a single secondary sigma-delta modulator 212.1. The quantization noise embedded in the analog output signal 250 may be further reduced by adding additional secondary sigma-delta modulators, such as a secondary sigma-delta modulator 212.2.

For example, a secondary sigma-delta modulator 212.2 may receive the secondary quantization error 264.1. The secondary sigma-delta modulator 212.2 sigma-delta modulates the secondary quantization error 264.1 to produce a secondary digital segment 266.2. More specifically, the secondary sigma-delta modulator 212.2 produces the secondary digital segment 266.2 by integrating and/or quantizing the secondary quantization error 264.1 to u bits, where u represents an integer number less than M. In other words, the secondary sigma-delta modulator 212.2 equivalently truncates the secondary quantization error 264.1 to u bits. The secondary digital segment 266.2 may be represented as:

$$y_{s2}[n]=q_{s1}[n]+q_{s2}[n]*h_{n2}[n] \quad (5),$$

where $y_{s2}[n]$ represents the secondary digital segment 266.2, $q_{s1}[n]$ represents the first secondary quantization error, $q_{s2}[n]$ represents a second secondary quantization error, and $h_{n2}[n]$ represents the impulse response of a noise transfer function of the secondary sigma-delta modulator 212.2. The second secondary quantization error $q_{s2}[n]$, denoted as a secondary quantization error 264.2 in FIG. 2, represents a difference between the secondary quantization error 264.1 and the secondary digital segment 266.2. In other words, the secondary quantization error 264.1 may represent a digital equivalent of a remaining M-s-t-u bits of the digital input signal 150.

A secondary noise module 214.2 shapes the secondary digital segment 266.2 by the noise transfer function of the primary sigma-delta modulator 202 and a noise transfer function of the secondary sigma-delta modulator 212.1 to produce a noise shaped secondary digital segment 268.2. The noise shaped secondary digital segment 268.2 may be represented as:

$$y_{s2}[n]=q_{s1}[n]*h_{n1}[n]*h_p[n]+q_{s2}[n]*h_{n2}[n]*h_{n1}[n]*h_p[n] \quad (6),$$

where $y_{s2}[n]$ represents the secondary digital segment 268.2, $q_{s1}[n]$ represents the first secondary quantization error, $h[n]$ represents the impulse response of the noise transfer function of the secondary sigma-delta modulator 212.1, $h_p[n]$ represents the impulse response of the noise transfer function of the primary sigma-delta modulator 202, $q_{s2}[n]$ represents a second secondary quantization error, and $h_{n2}[n]$ represents the impulse response of a noise transfer function of the secondary sigma-delta modulator 212.2. In an exemplary embodiment, the secondary noise module 214.2 provides overlap to the secondary digital segment 266.2 to allow the secondary noise module 214.2 to be implemented in a similar manner as the primary scrambler 208. In other words, the noise shaped secondary digital segment 268.2 has a substantially equivalent bit length as the delayed primary digital segment 256. However, this example is not limiting, those skilled in the relevant art(s) will recognize that the secondary noise module 214.2 need not provide overlap without departing from the spirit and scope of the present invention.

A secondary decoder module 216.2 decodes the noise shaped secondary digital segment 268.2 from u bits to $2^u$ lines to produce a secondary decoded digital signal 270.2. A secondary scrambler 218.2 scrambles the secondary decoded digital signal 270.2 to produce a secondary scrambled digital signal 272.2 A secondary DAC 220.2 converts the secondary scrambled digital signal 272.2 from a digital representation to an analog representation to produce a secondary analog segment 274.2. The secondary decoder module 216.2, the secondary scrambler 218.2, and the secondary DAC 220.2 operate in a manner that is substantially similar to the secondary decoder module 216.1, the secondary scrambler 218.1, and the secondary DAC 220.1 respectively and therefore will not be described in further detail.

The scaling module 222 combines the secondary analog segment 274.1 and the secondary analog segment 262.2 and scales or reduces the magnitude of the secondary analog segment 274.1 by a scaling factor of $2^t$ and a magnitude of the secondary analog segment 262.2 by a scaling factor of $2^u$ to produce the secondary analog segment 276. From the discussion above, the secondary sigma-delta modulator 212.1 equivalently truncates the secondary quantization error 264 to t bits. Likewise, the secondary sigma-delta modulator 212.2 equivalently truncates the secondary quantization error 264.1 to u bits.

The adder 224 combines the primary analog segment 262 and the secondary analog segment 276 to produce the analog output signal 250. The analog output signal 250 may be represented as:

$$y_i[n] = x_i[n] + \frac{q_{s2}[n] * h_{n2}[n] * h_{n1}[n] * h_p[n]}{2^u}, \quad (7)$$

where $y_i[n]$ represents the analog output signal 250, $q_{s2}[n]$ represents the second secondary quantization error, $h_{n2}[n]$ represents the impulse response of the noise transfer function of the secondary sigma-delta modulator 212.2, $h_{n1}[n]$ represents the impulse response of the noise transfer function of the secondary sigma-delta modulator 212.1, $h_p[n]$ represents the impulse response of the noise transfer function of the primary sigma-delta modulator 202, and $2^u$ represents the scaling factor.

The resolution of the DAC module 200 may be further increased without an increase in the number of butterfly circuits 170 in the primary scrambler 208 by including additional sigma-delta modulators 212. Although the DAC module 200 may include the primary scrambler 208 and the secondary scramblers 218.1 through 218.N, the number of butterfly circuits 170 in the primary scrambler 208 and the secondary scrambler 218.1 is substantially less than a number of butterfly circuits 170 in the scrambler 106 for a substantially similar bit resolution. Those skilled in the relevant art(s) will recognize that the quantity $$\frac{q_{s2}[n] * h_{n2}[n] * h_{n1}[n] * h_p[n]}{2^u}$$

is substantially less than or equal to the quantity $$\frac{q_{s1}[n] * h_{n1}[n] * h_p[n]}{2^t}.$$

As a result, quantization noise embedded in the analog output signal 250 has been substantially reduced by including the secondary sigma-delta modulator 212.1 and the secondary sigma-delta modulator 212.2.

The quantization noise embedded in the analog output signal 250 may be further reduced by cascading N additional secondary sigma-delta modulators in a manner similar as described above. Each additional secondary sigma-delta modulator modulates a secondary quantization error 264 from a previous secondary sigma-delta modulator in a manner similar as described above. For example, the secondary sigma-delta modulator 212.N modulates a secondary quantization error 264.(N−1) from a previous secondary sigma-delta modulator 212.(N−1). As discussed above, each additional secondary sigma-delta modulator shapes a corresponding secondary digital segment 266.N by the noise transfer function of the primary sigma-delta modulator 202 and all the previous secondary sigma-delta modulators 204.1 through 204.(N−1) to produce a corresponding noise shaped secondary digital segment 268.N. The noise shaped secondary digital segment 268.N may be represented as:

$$y_{sN}[n] = q_{s(N-1)}[n] * h_p[n] * h_1[n] * h_2[n] \ldots * h_{N-1}[n] + q_{sN}[n] * h_P[n] * h_2[n] \ldots * h_N[n] \quad (8),$$

where $y_{nN}[n]$ represents the noise shaped secondary digital segment 268.N, $q_{s(N-1)}[n]$ represents the secondary quantization error 264. (N−1) from the previous secondary sigma-delta modulator 212. (N−1), $h_p[n]$ represents the impulse response of the noise transfer function of the primary sigma-delta modulator 202, $h_1[n] * h_2[n] \ldots * h_{N-1}[n]$ represents a convolution of an impulse response of a noise transfer function of the secondary sigma-delta modulators 204.1 through 204. (N−1), and $h[n] * h_2[n] \ldots * h_N[n]$ represents a convolution of an impulse response of a noise transfer function of the secondary sigma-delta modulators 212.1 through 212.N.

From the discussion above, the scaling module 222 combines the secondary analog segments 274.1 through 274.N and scales or reduces the magnitude of each of the secondary analog segments 274.1 through 274.N by a corresponding scaling factor, wherein the scaling factor may be given as $$s.f. = 2^x, \quad (9),$$

where s.f. represents the corresponding scaling factor for a corresponding secondary analog segment 274.1 through 274.N and x represents a number of bits in a corresponding secondary digital segment 266.1 through 266.N.

Figure 3A:
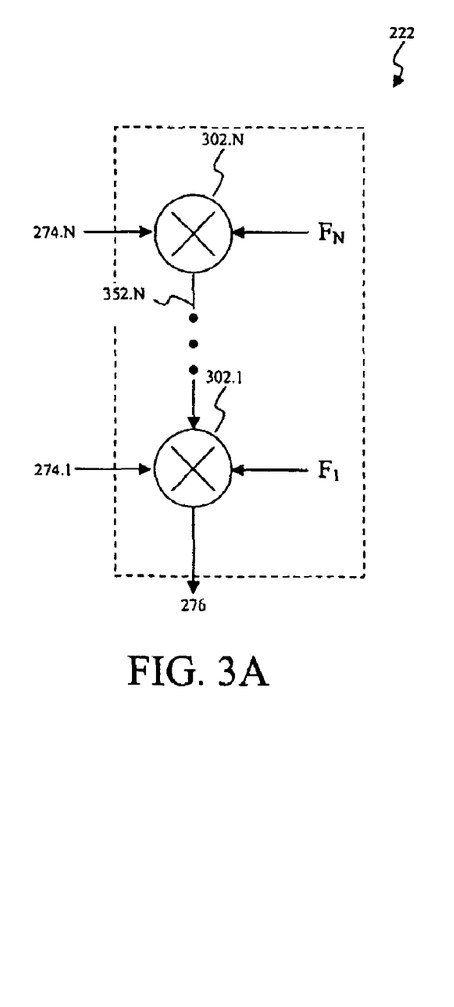
FIG. 3A illustrates a block diagram of a scaling module according to an exemplary embodiment of the present invention.

FIG. 3A illustrates a block diagram of a scaling module according to an exemplary embodiment of the present invention. As shown in FIG. 3A, this exemplary embodiment of the scaling module 222 cascades multipliers 302.1 through 302.N. For example, the multiplier 302.N multiplies the secondary analog segment 274.N by a corresponding scaling factor $F_N$ to produce a scaled analog segment 352.N. Likewise, a multiplier 274.1 multiplies the secondary analog segment 274.N by a corresponding scaled analog segment 352 produce the secondary analog segment 276.

Figure 3B:
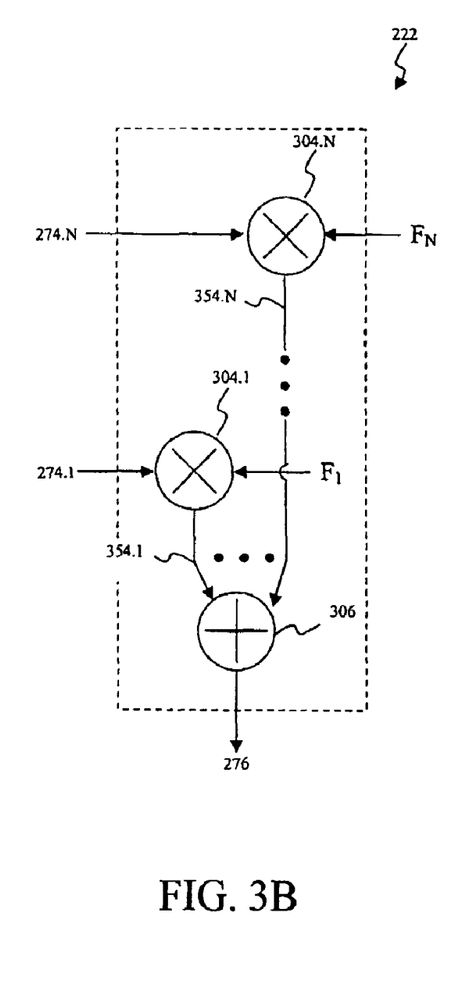
FIG. 3B illustrates a block diagram of a scaling module according to another exemplary embodiment of the present invention.

FIG. 3B illustrates a block diagram of a scaling module according to another exemplary embodiment of the present invention. As shown in FIG. 3B, this exemplary embodiment of the scaling module 222 includes multipliers 302.1 through 302.N. Each multiplier 302 multiplies a corresponding secondary analog segment 274.1 through secondary analog segment 274.N by a corresponding scaling factor $F_1$ through $F_N$ to produce a corresponding scaled analog segment 354.1 through 354.N. For example, the multiplier 304.1 multiplies the secondary analog segment 274.1 by a corresponding scaling factor $F_1$ to produce a scaled analog segment 352.1. An adder 306 adds the scaled analog segments 354.1 through 354.N to produce the secondary analog segment 276.

Figure 4:
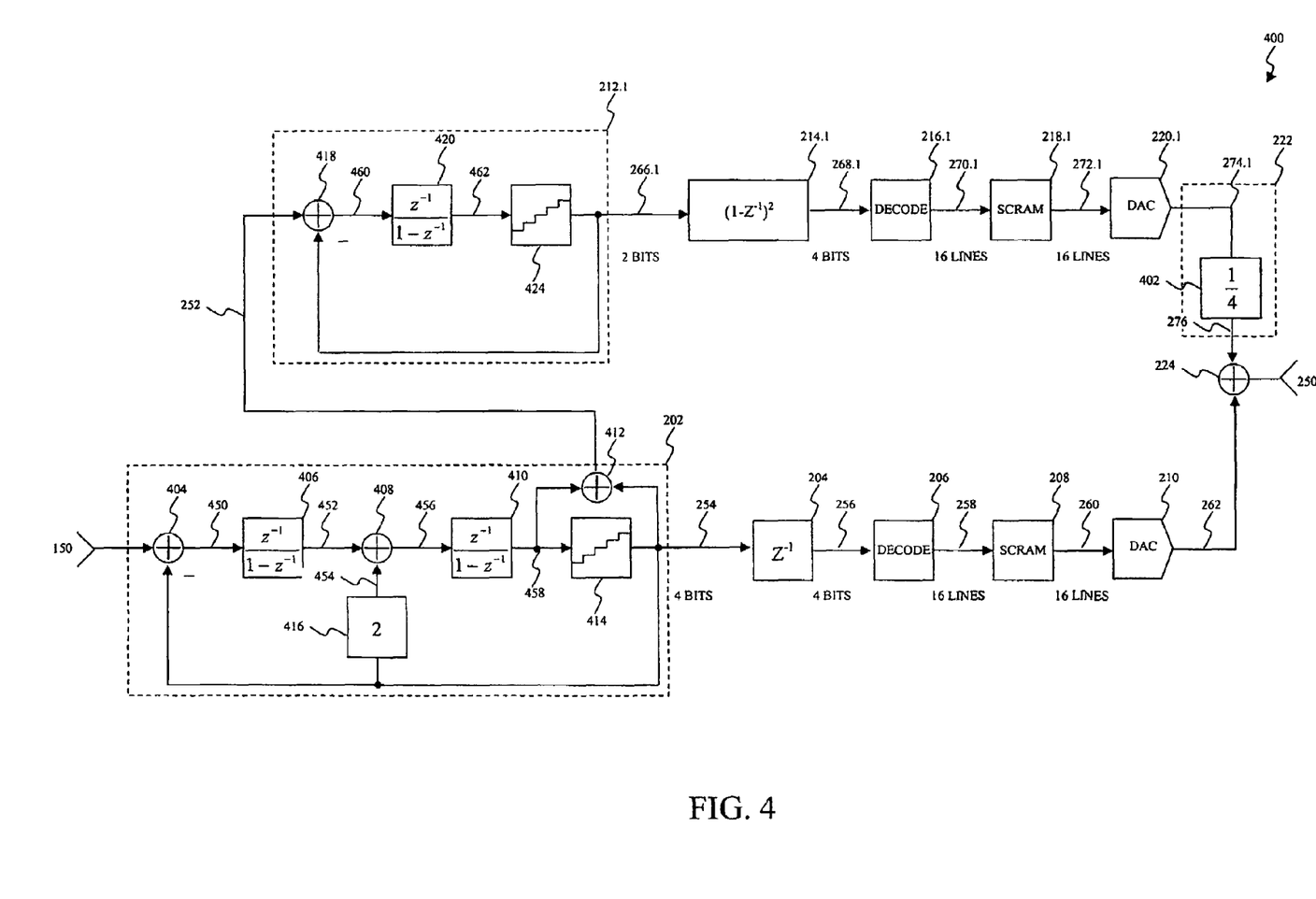
FIG. 4 illustrates a block diagram of a digital to analog converter (DAC) according to another exemplary embodiment of the present invention.

FIG. 4 illustrates a block diagram of a digital to analog converter (DAC) according to another exemplary embodiment of the present invention. A DAC 400 further defines the DAC module 200 according to embodiments of the present invention. However, this example is not limiting, those skilled in the relevant art(s) will recognize that the DAC module 200 as discussed above may be implemented using the teachings herein without departing from the spirit and scope of the present invention.

The DAC 400 converts the digital input signal 150 to an analog output signal 250. In this exemplary embodiment, the digital input signal 150 includes sixteen bits represented by bits $B_1$ through $B_{16}$, where $B_{16}$ represents a most significant bit (MSB) of the digital input signal 150 and $B_1$ represents a least significant bit (LSB) of the digital input signal 150.

Referring back to FIG. 4, the primary sigma-delta modulator 202 receives the digital input signal 150. The primary sigma-delta modulator 202 is implemented as second order delta sigma modulator. However, this example is not limiting, those skilled into the relevant art(s) will recognize that the primary sigma-delta modulator 202 may be implemented as a first order delta sigma modulator, a multi-stage noise shaping (MASH) modulator and/or any other suitable well-known sigma-delta modulator without departing from the spirit and scope of the present invention.

The primary sigma-delta modulator 202 produces the primary digital segment 254 by integrating and/or quantizing the digital input signal 150 to four bits. The primary sigma-delta modulator 202 includes an adder 404, an integrator 406, an adder 408, an integrator 410, an adder 412, a quantizer 414, and a scaling module 416. The adder 404 combines the primary digital segment 254 and the digital input signal 150 to produce a delta 450. The primary sigma-delta modulator 202 automatically adjusts the primary digital segment 254 to ensure that the difference between the primary digital segment 254 and the digital input signal 150 is on average zero.

The integrator 406 integrates the delta 450 to produce a sigma 452. The integrator 406 may be implemented using any suitable electrical circuit or network whose output is a time integral of its input. The sigma 452 represents the sum of all past values of the delta 450, whereby a value of non-zero for the delta 450 may cause the integrator 406 to adjust the sigma 452 so that the value of the delta 450 is on average zero. The adder 408 combines the sigma 452 and a scaled primary digital segment 454 to produce a delta 456. A scaling module 416 scales the primary digital segment 254 by two to produce the scaled primary digital segment 454. The primary sigma-delta modulator 202 automatically adjusts the primary digital segment 254 to ensure that the difference between the sigma 452 and the scaled primary digital segment 454 is on average zero.

The integrator 410 integrates the delta 456 to produce a sigma 458. The integrator 410 may be implemented using any suitable electrical circuit or network whose output is a time integral of its input. The sigma 458 represents the sum of all past values of the delta 456, whereby a value of non-zero for the delta 456 may cause the integrator 410 to adjust the sigma 458 so that the value of the delta 456 is on average zero. The quantizer 414 assigns the sigma 458 to one of 16 levels corresponding to four bits to produce the primary digital segment 254. An adder 412 combines the sigma 458 and the primary digital segment 254 to produce the primary quantization error 252. The primary quantization error represents a difference between the sigma 458 and the primary digital segment 254.

The primary sample delay 204 delays the primary digital segment 254 by one sample to produce a delayed primary digital segment 256. The primary decoder module 206 decodes the delayed primary digital segment 256 from four bits to sixteen lines to produce the primary decoded digital signal 258. The primary scrambler 208 scrambles the primary decoded digital signal 258 to produce the primary scrambled digital signal 260. The primary scrambler 208 uses 32 butterfly circuits 170. The primary DAC 210 converts the primary scrambled digital signal 260 from a digital representation to an analog representation to produce the primary analog segment 262.

The secondary sigma-delta modulator 212.1 produces the secondary digital segment 266.1 by integrating and/or quantizing the primary quantization error 252 to two bits. The secondary sigma-delta modulator 212.1 is implemented as a first order delta sigma modulator. However, this example is not limiting, those skilled into the relevant art(s) will recognize that the secondary sigma-delta modulator 212.1 may be implemented as a second order delta sigma modulator, a multi-stage noise shaping (MASH) modulator and/or any other suitable well-known sigma-delta modulator without departing from the spirit and scope of the present invention.

The secondary sigma-delta modulator 212.1 produces the secondary digital segment 266.1 by integrating and/or quantizing the primary quantization error 252 to two bits. The secondary sigma-delta modulator 212.1 includes an adder 418, an integrator 420, and a quantizer 422. The adder 418 combines the primary quantization error 252 and the secondary digital segment 266.1 to produce a delta 460. The secondary sigma-delta modulator 212.1 automatically the secondary digital segment 266.1 to ensure that the difference between the secondary digital segment 266.1 and the primary quantization error 252 is on average zero. The integrator 406 integrates the delta 460 to produce a sigma 462. The integrator 420 may be implemented using any suitable electrical circuit or network whose output is a time integral of its input. The sigma 462 represents the sum of all past values of the delta 460, whereby a value of non-zero for the delta 460 may cause the integrator 420 to adjust the sigma 462 so that the value of the delta 460 is on average zero. The quantizer 424 assigns the sigma 462 to one of four levels corresponding to two bits to produce the secondary digital segment 266.1.

The secondary noise module 214.1 shapes the secondary digital segment 266.1 to four bits by multiplying the secondary digital segment 266.1 by the quantity:

$$(1-Z^{-1})^2, \tag{10}$$

where the quantity $(1-Z^{-1})^2$ represents the noise transfer function of the primary sigma-delta modulator 202.

The secondary decoder module 216.1 decodes the delayed secondary digital segment 266.1 from four bits to sixteen lines to produce the secondary decoded digital signal 270.1. The secondary scrambler 218.1 scrambles the secondary decoded digital signal 270.1 to produce the secondary scrambled digital signal 272.1. The secondary scrambler 218.1 uses 32 butterfly circuits 170. The secondary DAC 220.1 converts the secondary scrambled digital signal 272.1 from a digital representation to an analog representation to produce the secondary analog segment 274.1.

The scaling module 222 scales or reduces the magnitude of the secondary analog segment 274.1 by a scaling factor of ¼, denoted as 402, to produce the secondary analog segment 276. The adder 224 combines the primary analog segment 262 and the secondary analog segment 276 to produce the analog output signal 250.

Figure 5:
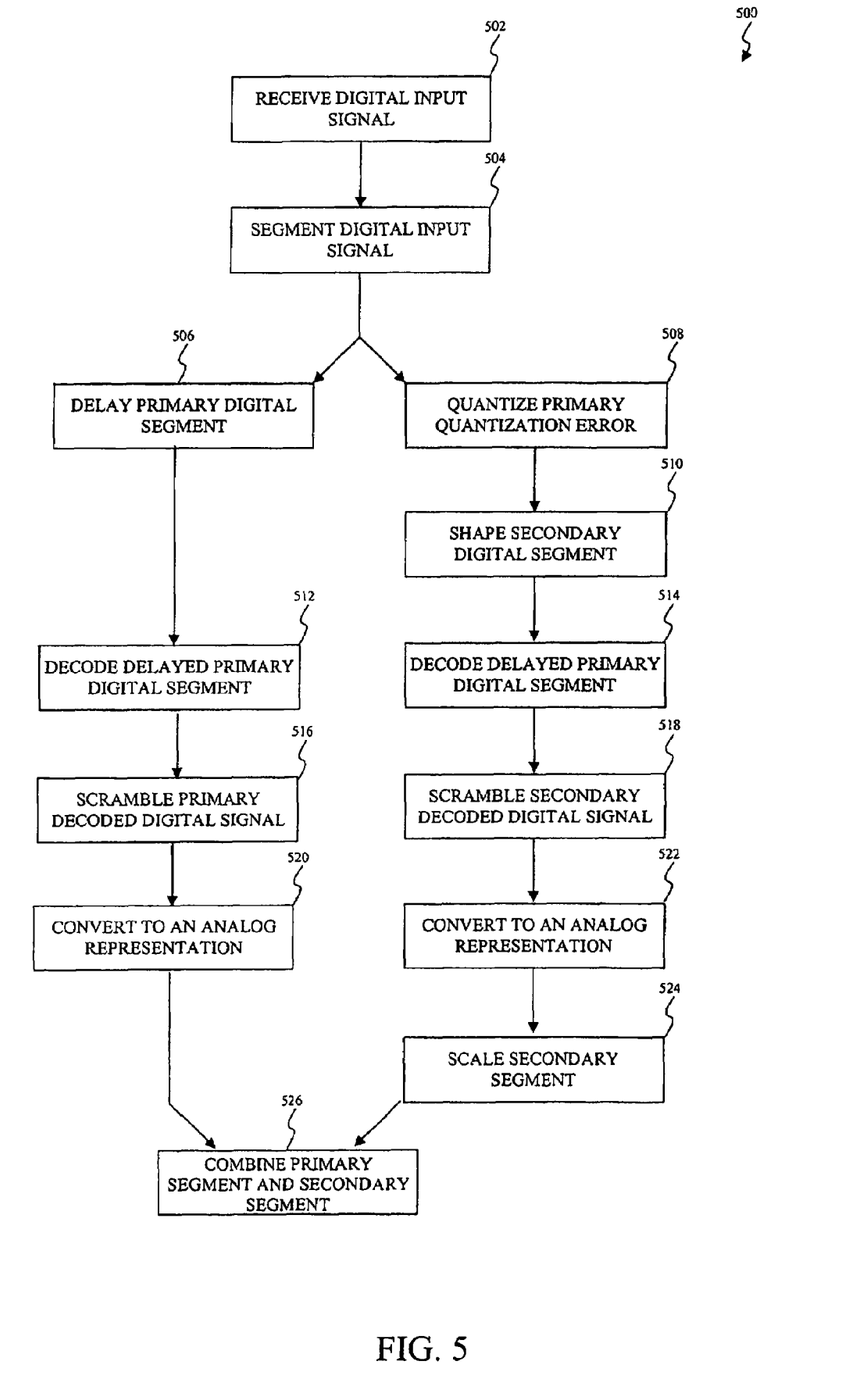
FIG. 5 is a flowchart of exemplary operational steps of a digital to analog converter (DAC) according to an exemplary embodiment of the present invention.

FIG. 5 is a flowchart 500 of exemplary operational steps of a digital to analog converter (DAC) according to an exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 5.

At step 502, a digital input signal, such as the digital input signal 150, is received by a DAC. The DAC converts the digital input signal to an analog output signal, such as the analog output signal 250. The digital input signal includes M bits represented by bits $B_1$ through $B_M$, where $B_M$ represents a most significant bit (MSB) of the digital input signal and $B_1$ represents a least significant bit (LSB) of the digital input signal. However, this example is not limiting, those skilled in the relevant art(s) will recognize that the digital input signal may include any suitable number of bits in any suitable arrangement without departing from the spirit and scope of the present invention.

At step 504, the digital input signal is segmented to produce a primary digital segment and a primary quantization error. More specifically, the digital input signal is quantized to produce the primary digital segment and the primary quantization error. A sigma-delta modulator, such as the primary sigma-delta modulator 202, may quantize the digital input signal. More specifically, the primary sigma-delta modulator produces the primary digital segment by integrating and/or quantizing the digital input signal to s bits to produce the primary digital segment. The primary quantization error represents a difference between the primary digital segment and the digital input signal.

At step 506, the primary digital segment is delayed by a duration of step 508 and step 510.

At step 508, the primary quantization error is quantized to produce a secondary digital segment. A sigma-delta modulator, such as the secondary sigma-delta modulator 212, may quantize the primary quantization error. More specifically, the secondary sigma-delta modulator produces the secondary digital segment by integrating and/or quantizing the primary quantization error to t bits to produce the primary digital segment. The secondary quantization error represents a difference between the secondary digital segment and the primary quantization error.

At step 510, the secondary digital segment is shaped by a noise transfer function of the sigma-delta modulator of step 504 to produce a noise shaped secondary digital segment. The noise shaped secondary digital segment may be represented as:

$$y_{n1}[n] = q_p[n] * h_p[n] + q_{s1}[n] * h_{n1}[n] * h_p[n] \quad (11),$$

where $y_{n1}[n]$ represents the noise shaped secondary digital segment, $q_p[n]$ represents the primary quantization error, $h_p[n]$ represents the impulse response of the noise transfer function of the sigma-delta modulator of step 504, $q_{s1}[n]$ represents the first secondary quantization error, and $h_{n1}[n]$ represents the impulse response of the noise transfer function of the secondary sigma-delta modulator.

At step 512, the delayed primary digital segment is decoded from s bits to $2^s$ lines to produce a primary decoded digital signal. In other words, a decoder, such as the primary decoder 206, maps a current value of the delayed primary digital segment from s bits to a corresponding set of lines amongst the $2^s$ lines. The decoder may decode the s bits of the delayed primary digital segment to $2^s$ lines using any suitable code such as a well known thermometer code to provide an example.

At step 514, the noise shaped secondary digital segment is decoded from t bits to $2^t$ lines to produce a secondary decoded digital signal. In other words, a decoder, such as the secondary decoder 216, maps a current value of the delayed secondary digital segment from t bits to a corresponding set of lines amongst the $2^t$ lines. The decoder may decode the t bits of the noise shaped secondary digital segment to $2^t$ lines using any suitable code such as a well known thermometer code to provide an example.

At step 516, the primary decoded digital signal is scrambled to produce a primary scrambled digital signal. A scrambler, such as the primary scrambler 208, scrambles the primary decoded digital signal to produce the primary scrambled digital signal. More specifically, the scrambler dynamically maps the primary decoded digital signal to the primary scrambled digital signal such that the primary decoded digital signal is equally represented in the primary scrambled digital signal over a relatively small number of clock cycles.

At step 518, the secondary decoded digital signal is scrambled to produce a secondary scrambled digital signal. A scrambler, such as the secondary scrambler 218, scrambles the secondary decoded digital signal to produce the secondary scrambled digital signal. More specifically, the scrambler dynamically maps the secondary decoded digital signal to the secondary scrambled digital signal such that the secondary decoded digital signal is equally represented in the secondary scrambled digital signal over a relatively small number of clock cycles.

At step 520, the primary scrambled digital signal is converted from a digital representation to an analog representation to produce a primary analog segment. A DAC, such as the primary DAC 210, converts the primary scrambled digital signal from the digital representation to the analog representation.

At step 522, the secondary scrambled digital signal is converted from a digital representation to an analog representation to produce a pre-scaled secondary analog segment. A DAC, such as the secondary DAC 220, converts the secondary scrambled digital signal from the digital representation to the analog representation.

At step 524, the magnitude of the secondary analog segment is scaled or reduced. A scaling module, such as the scaling module 222, scales or reduces the magnitude of the pre-scaled secondary analog segment by a scaling factor of $2^t$ to produce the secondary analog segment.

At step 526, the primary analog segment and the secondary analog segment are combined to produce the analog output signal.

CONCLUSION

While various embodiments of the present invention have been described above, it should be understood that they have been presented by way of example, and not limitation. It will be apparent to persons skilled in the relevant art(s) that various changes in form and detail may be made therein without departing from the spirit and scope of the invention. Thus the present invention should not be limited by any of the above-described exemplary embodiments, but should be defined only in accordance with the following claims and their equivalents.

What is claimed is:

1. A digital to analog converter (DAC) module configured to convert a digital input signal to an analog output signal, comprising:

a primary sigma-delta modulator configured to reduce a resolution of the digital input signal from a first number of bits to a second number of bits to produce a primary digital segment and a primary quantization error, the second number of bits being less than the first number of bits;

a primary scrambler configured to scramble the primary digital segment to provide a primary scrambled digital signal using a first number of butterfly circuits;

a primary DAC configured to convert the primary scrambled digital signal from a digital representation to an analog representation to provide a primary analog segment;

a secondary scrambler configured to scramble the primary quantization error to provide a secondary scrambled digital signal using a second number of butterfly circuits, the second number of butterfly circuits being equal to the first number of butterfly circuits; and a secondary DAC configured to convert the secondary scrambled digital signal from a digital representation to an analog representation to provide a secondary analog segment;

an adder configured to combine the primary scrambled digital signal and the secondary scrambled digital signal to produce the analog output signal.

2. The DAC module of claim 1, further comprising:

a secondary sigma-delta modulator configured to reduce a resolution of the primary quantization error from the first number of bits to a third number of bits to produce a secondary digital segment and a secondary quantization error, the third number of bits being less than the first number of bits; and a secondary noise module configured to shape the secondary digital segment by a noise transfer function of the primary sigma-delta modulator to produce a noise shaped secondary digital segment, wherein the secondary scrambler is configured to provide the secondary scrambled digital signal based on the noise shaped secondary digital segment.

3. The DAC module of claim 2, wherein the noise transfer function of the primary sigma-delta modulator is represented by $(1-Z^{-1})^2$.

4. The DAC module of claim 1, further comprising:

a scaling module configured to scale the secondary analog segment by a scaling factor to produce a scaled secondary analog segment.

5. The DAC module of claim 4, wherein the scaling factor is based on a number of bits in the secondary digital segment.

6. The DAC module of claim 1, wherein the primary quantization error represents a digital equivalent of a remaining number of bits from the first number of bits, the remaining number of bits representing a difference between the first number of bits and the second number of bits.

7. The DAC module of claim 1, wherein the primary sigma-delta modulator is configured to reduce a resolution of the digital input signal from sixteen bits to four bits.

8. The DAC module of claim 1, further comprising:

a primary sample delay configured to delay the primary digital segment by one or more samples to provide a delayed primary digital segment, the primary scrambler being configured to provide the primary scrambled digital signal based upon the delayed primary digital segment.

9. A method to convert from a digital input signal to an analog output signal, comprising:

reducing a resolution of the digital input signal from a first number of bits to a second number of bits to produce a primary digital segment and a primary quantization error, the second number of bits being less than the first number of bits;

scrambling the primary digital segment to provide a primary scrambled digital signal using a first number of butterfly circuits;

converting the primary scrambled digital signal to an analog representation to provide a primary analog segment;

scrambling the primary quantization error to provide a secondary scrambled digital signal using a second number of butterfly circuits, the second number of butterfly circuits being equal to the first number of butterfly circuits;

converting the secondary scrambled digital signal from a digital representation to an analog representation to provide a secondary analog segment; and combining the primary scrambled digital signal and the secondary scrambled digital signal to produce the analog output signal.

10. The method of claim 9, further comprising:

reducing a resolution of the primary quantization error from the first number of bits to a third number of bits to produce a secondary digital segment and a secondary quantization error, the third number of bits being less than the first number of bits; and shaping the secondary digital segment by a noise transfer function of a primary sigma-delta modulator to produce a noise shaped secondary digital segment, the secondary analog segment being provided based on the noise shaped secondary digital segment.

11. The method of claim 10, wherein the step of shaping the secondary digital segment by a noise transfer function of a primary sigma-delta modulator further comprises:

shaping the secondary digital segment by $(1-Z^{-1})^2$.

12. The method of claim 9, further comprising:

scaling the secondary analog segment by a scaling factor to produce a scaled secondary analog segment.

13. The method of claim 12, wherein the step of scaling the secondary analog segment by the scaling factor further comprises:

scaling the secondary analog segment by a number of bits in the secondary digital segment.

14. The DAC module of claim 1, further comprising:

a primary decoder module configured to provide a primary decoded digital signal having a first number of lines based upon the primary digital segment having the first number of bits, the primary scrambler being configured to scramble the primary decoded digital signal to produce the primary scrambled digital signal.

15. The method of claim 9, wherein the primary quantization error represents a digital equivalent of a remaining number of bits from the first number of bits, the remaining number of bits representing a difference between the first number of bits and the second number of bits.

16. The method of claim 9, wherein the step of the resolution of the digital input signal comprises:

reducing a resolution of the digital input signal from sixteen bits to four bits.

17. The method of claim 9, further comprising:

delaying configured to delay the primary digital segment by one or more samples to provide a delayed primary digital segment, the delayed primary digital segment being scrambled to provide the primary scrambled digital signal using the first number of butterfly circuits.

18. The method of claim 9, further comprising:

decoding the primary digital segment having the first number of bits to provide a primary decoded digital signal having a first number of lines, the primary decoded digital signal being scrambled to provide the primary scrambled digital signal using the first number of butterfly circuits.

* * * * *